United States Patent [19]

Yamada

[11] 4,450,464
[45] May 22, 1984

[54] SOLID STATE AREA IMAGING APPARATUS HAVING A CHARGE TRANSFER ARRANGEMENT

[75] Inventor: Takahiro Yamada, Katano, Japan

[73] Assignee: Matsushita Electric Industrial Co., Ltd., Osaka, Japan

[21] Appl. No.: 285,317

[22] Filed: Jul. 22, 1981

[30] Foreign Application Priority Data

Jul. 23, 1980 [JP] Japan .................. 55-101617
Jul. 23, 1980 [JP] Japan .................. 55-101618

[51] Int. Cl.³ ............... H01L 27/14; H01L 31/00; H01L 29/80; H01L 29/78
[52] U.S. Cl. ........................... 357/30; 357/22; 357/50; 357/24
[58] Field of Search ............. 357/22, 24, 30, 50

[56] References Cited

U.S. PATENT DOCUMENTS

| | | | |
|---|---|---|---|
| 3,796,927 | 3/1974 | Boyle et al. | 357/24 |
| 3,845,295 | 10/1974 | Williams et al. | 357/30 |
| 3,906,543 | 9/1975 | Smith et al. | 357/24 LR |
| 4,104,674 | 8/1978 | Lorenze et al. | 357/24 LR |
| 4,131,810 | 12/1978 | Knauer et al. | 357/24 LR |
| 4,197,553 | 4/1980 | Finnila et al. | 357/24 LR |
| 4,326,210 | 4/1982 | Aso et al. | 357/22 |
| 4,373,167 | 2/1983 | Yamada | 357/24 LR |
| 4,377,817 | 3/1983 | Nishizawa et al. | 357/22 |

*Primary Examiner*—Gene M. Munson
*Attorney, Agent, or Firm*—Wenderoth, Lind & Ponack

[57] ABSTRACT

A solid state area imaging apparatus having a photosensor matrix array disposed at a front surface area of a substrate and having a charge transfer arrangement for transferring charges generated in the photosensors of the matrix so as to convert them into a serial signal. It also includes a penetrative charge transfer arrangement for transferring the charge from the front surface area of the substrate to the back surface area of the substrate, and which has a static induction transistor structure. The charges are transferred vertically through a channel formed in the structure of the static induction transistor. This penetrative charge transfer arrangement may be used as a part of the transfer path for generating the serial signal or a path for removing excess charges which are generated in the photosensors.

6 Claims, 16 Drawing Figures

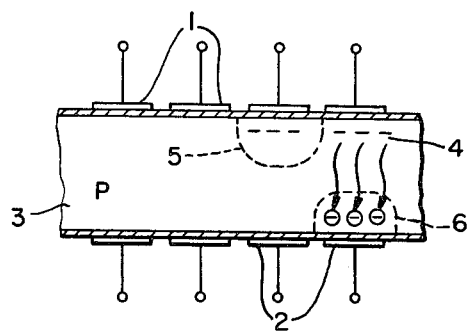
FIG. 1.
(PRIOR ART)
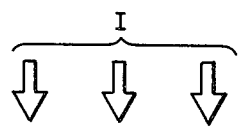
FIG. 2A.
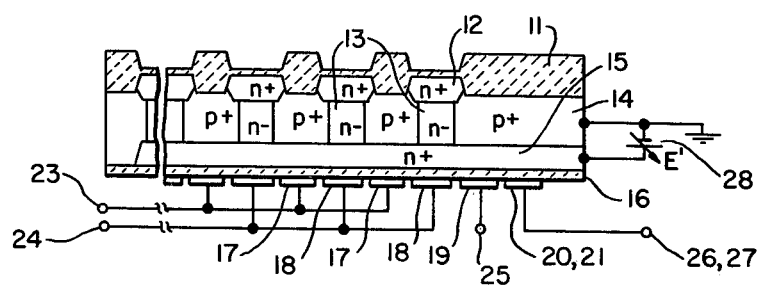
FIG. 2B.
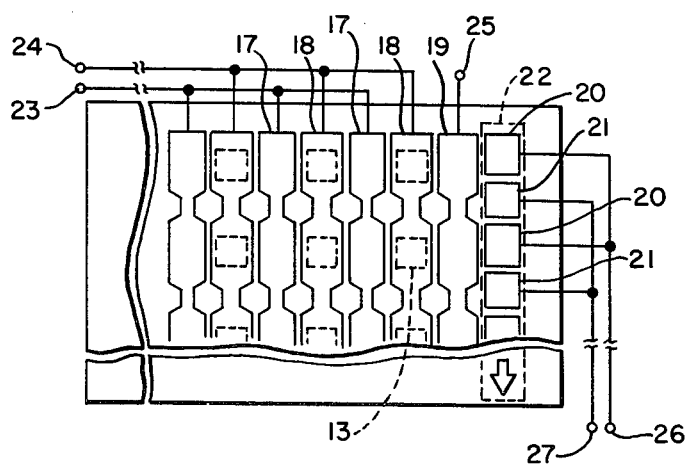
FIG. 3A.
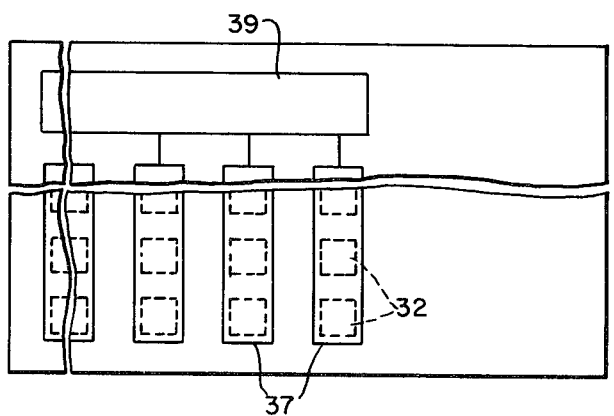

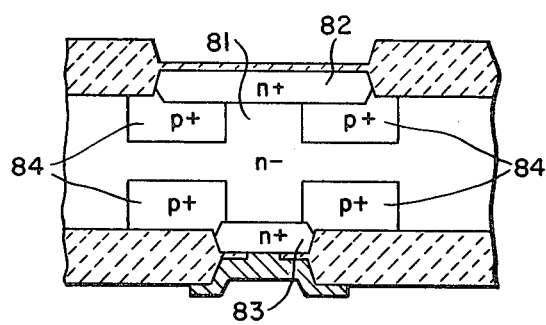
FIG. 6.
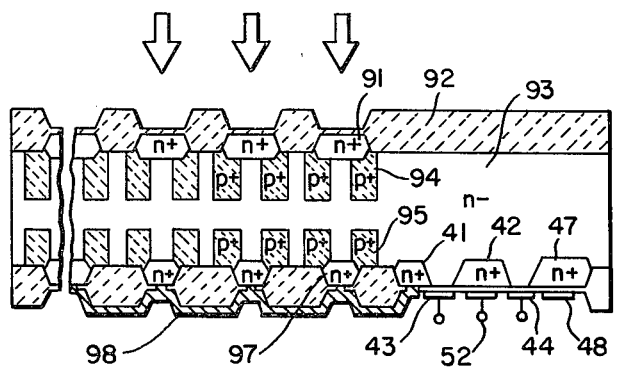
FIG. 7A.
FIG. 7B.
FIG. 8A.

SOLID STATE AREA IMAGING APPARATUS HAVING A CHARGE TRANSFER ARRANGEMENT

BACKGROUND OF THE INVENTION

This invention relates to a solid state area imaging apparatus which convert a two dimensional optical image into an electrical signal.

An ordinary area imaging apparatus constructed two-dimensionally cannot avoid having a decrease in its photodiode area, which means a decrease in its sensitivity, as its packing density increases. Thus, it has been desired to three-dimensionally construct an area imaging apparatus with very large scale integration.

A hitherto known example of the three-dimensional structure is a CCD such as that shown in FIG. 1. It has transfer electrodes 1 and 2 on both sides of the semiconductor substrate 3, in which a charge is not only horizontally but also vertically transferred. The vertical transfer process therein is as follows.

Charges 4 are retained and transferred by a depletion region 5 in a front surface area of the substrate 3 and then injected into the inside of the substrate 3 by removing the depletion region. The injected charges are collected at the depletion region 6 formed in the back surface area of the substrate 3.

Such a vertical charge transfer has had a disadvantage in that the charge is laterally diffused after the injection, which decreases the charge collection efficiency on the other side of the substrate. A further disadvantage is the random noise caused by the fluctuation of the charge injection. It has also been necessary to drive the transfer electrodes with a high voltage so as to sufficiently extend the depletion region.

In order to get over said disadvantages, it is necessary to make the substrate thin, say, a few tens of microns. However, this makes the fabrication process very difficult when the chip size is large and also makes the substrate very fragile.

SUMMARY OF THE INVENTION

It is an object of the invention to provide a solid state area imaging apparatus in which charges are transferred vertically to a substrate, i.e. penetratively through the substrate, with a high transfer efficiency. According to the invention, the imaging apparatus includes a penetrative charge transfer means for transferring charges penetratively through a substrate, and which comprises: a first semiconductor region of a first type of conductivity disposed at the front surface area of the substrate; a second semiconductor region of the first type of conductivity disposed at the back surface area of the substrate; a third semiconductor region of the first type of conductivity and having a low impurity concentration which extends between said first and second regions and is in contact with those two regions; a fourth semiconductor region of a second type of conductivity disposed around said third region so as to substantially define the third region from its surroundings; and a control means for supplying the first, second or the fourth region with a control voltage whereby a channel is formed in said third region between said first and second regions.

BRIEF DESCRIPTION OF THE DRAWINGS

FIG. 1 shows a conventional CCD with a penetrative charge-transfer means;

FIG. 2A is a schematic sectional view of a solid state area imaging apparatus embodying the present invention;

FIG. 2B is a bottom plan view of FIG. 2A;

FIG. 3A is a schematic plan view of another embodiment of the invention;

FIGS. 5 and 6 are sectional views showing further embodiments of the structure of the charge penetration region according to the invention;

FIG. 7A is a schematic sectional view of a further embodiment of a solid state area imaging apparatus according to the invention;

FIG. 7B is a plan view of FIG. 7A;

FIG. 8A is a schematic sectional view showing an element of photo-sensing area with anti-blooming structure in a further embodiment of a solid state area imaging apparatus according to the invention;

DETAILED DESCRIPTION OF THE INVENTION

Figure 3B:
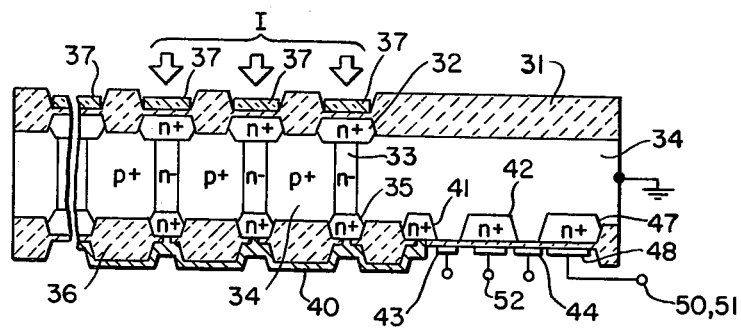
FIG. 3B is a sectional view of FIG. 3A.

FIG. 2 shows an example of a solid state area imaging apparatus embodying the invention.

In FIGS. 2A and 2B, n+ regions 12, which are arranged two-dimensionally and which are separated by an oxide layer 11, form photo-diode matrix array. An n− region 13 vertically to the substrate under each of the n+ regions 12. The n− regions 13 are separated from each other by a p+ region 14. An n+ region 15 is disposed under the n− regions 13 and the p+ region 14. The n+ region 15 is covered with an oxide layer 16. Transfer electrodes 17 and 18 are disposed on the oxide layer 16. The n+ region 15 works as a buried CCD and is controlled by the transfer electrodes 17 and 18. A transfer gate 19 and transfer electrodes 20 and 21 are also disposed on the oxide layer 16 so as to form a one-dimensional, or horizontal, CCD 22.

Terminals 23 and 24 are provided for supplying the transfer electrodes 17 and 18 with a two-phase operating pulse. A terminal 25 is connected to the transfer gate 19. Terminals 26 and 27 are connected to the transfer electrodes 20 and 21 for operating the horizontal CCD 22. An external control voltage source 28 is coupled to the n+ region 15.

The n+ region 12 forms a photodiode and a signal charge is generated therein due to an incidence of an image light I.

The n− region 13 operates as a penetration area through which the charge generated in the n+ region 12 is vertically transferred to the n+ region 15. The feature of this invention exists in the structure for controlling the vertical transfer of the charge through the n− region 13. The n+ region 12, n− region 13, n+ region 15 and p+ region 14 construct a static induction transistor (hereinafter referred to briefly as an SIT). SIT devices are, for example, in: "IEEE Trans. on Electron Devices", ED-22, No. 4, 1975, p. 185, "IEEE Journal of Solid State Circuits", vol. SC-13, No. 5, 1978, p. 622, etc.

The n+ region 12 corresponds to a source, the n+ region 15 a drain, the n− region 13 a channel forming region and the p+ region 14 a gate. The amount of majority carriers flowing from the n+ region 12 to the n+ region 15 is controlled by varying the voltage supplied to the n+ region 15 from the control voltage source 28.

The SIT in reverse gate biased operation corresponds to an extremely short channel FET. The channel resistance $r_s$ of the SIT, i.e. the resistance between a source and a pinch-off point, is arranged so as to be small in order to satisfy the condition that $r_s \cdot G_m < 1$ in a low drain current range irrespective of the magnitude of the gate bias voltage, where $G_m$ is the intrinsic transconductance under the condition of zero series-resistance. The pinch-off point is defined as a point where the depletion regions touch near the source.

When a junction SIT is operated in a forward gate biased condition, it corresponds to a bipolar transistor with an extremely thin base structure.

The transfer electrodes 17 and 18 form a two-dimensional CCD for temporarily storing the signal charges transferred from the n+ regions 12 and for transferring them in a column line direction. Such a CCD is used for performing a frame transfer method such as that shown, for example, in "IEEE Trans. on Electron Device", ED-20, No. 3, 1973, p. 244. The horizontal CCD 22 is used for receiving the signal charges of one line from the two-dimensional CCD through the transfer gate 19 and for transferring the charges in a horizontal line direction to an output terminal.

Operation of this apparatus is as follows.

During one field interval, the signal charges are generated in the n+ regions 12 by an input image light I and stored therein. In this period, the external control voltage source 28 supplies with a low level voltage so that the potential barrier at an intrinsic gate in the n− region 13 is high, thereby causing the charge in the n+ region 12 to be retained therein.

In a horizontal blanking period, the voltage supplied from the voltage source 28 becomes a high level and the potential barrier of the intrinsic gate becomes low. The signal charges stored in the n+ region 12 are then transferred through the n+ region 13 to the n+ region 15 and are caught in the depletion region formed in the n+ region 15 by a voltage supplied to the transfer gates 17 and 18. After such a penetrative charge transfer through the substrate has been completed, the voltage source 28 returns back to its initial low level.

Being controlled by the two phase pulses supplied to the transfer gates 17 and 18, the two-dimensional CCD shifts the signal charges on each one horizontal line in parallel toward the horizontal CCD 22 during a horizontal perod. Thus, the signal charges are finally delivered to the horizontal CCD 22 through the transfer gate 19.

Then, the charges of each one horizontal line are transferred serially to the output terminal during a horizontal scanning period by the horizontal CCD 22 which is operated by high speed two phase pulses supplied to the transfer electrodes 20 and 21.

According to the above-mentioned structure, since the charge transfer from the photodiode area to the two-dimensional CCD is made through the channel of the SIT structure, the lateral diffusion of the charge does not occur and so an almost perfect charge collection is achieved, without requiring a large voltage to be supplied to the electrodes 17 and 18. Furthermore, random noise is low because of the low channel resistance in n− region 13.

A channel distance L in n− region is restricted by the channel doping $N_D$; for example, if $N_D = 10^{13}$ cm$^{-3}$, then L is 50 to 60 microns. However, by using an intrinsic region as the penetrative charge transfer region, the channel distance L becomes larger. Therefore, it becomes unnecessary to use a thin substrate.

Thus, according to the invention, it is easy to use the structure for transferring the signal charges penetratively through the substrate, resulting in the achievement of a large photodiode area.

Figure 3C:
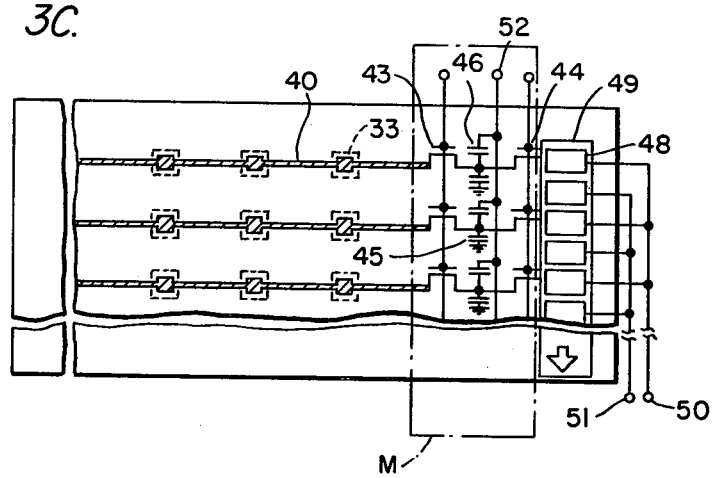
FIG. 3C is a bottom plan view of FIG. 3A.

FIGS. 3A, 3B and 3C respectively show a plan view, a cross-sectional view and a bottom plan view of another embodiment of an imaging apparatus according to the invention. In these figures, the numeral 31 denotes an oxide layer. The n+ regions 32 are separated from each other by the oxide layer 31 so as to form photodiode matrix arrays. Under each of the n+ regions 32 is formed an n− region 33 extending vertically through a p+ substrate 34. The n− region 33 reaches an n+ region 35 formed on the reverse side of the substrate 34. The n+ regions 35 are separated by an oxide layer 36.

Above the n+ regions 32 are provided transparent electrodes 37 which are coupled to a vertical scanning shift register 39. The n+ regions 35 on each column line are coupled to a respective vertical transport line 40 of Al electrode.

An area M shown in FIG. 3C represents a parallel-serial conversion area including two rows of n+ regions 41 and 42, each row of transfer gates 43 and 44 and a row of temporary storage capacitors 45. A bootstrap capacitor 46 is coupled to the temporary storage capacitor 45. The n+ regions 47 and electrodes 48 form a horizontal CCD 49. The electrodes 48 are supplied with driving pulses through terminals 50 and 51.

This embodiment differs from the embodiment of FIGS. 2A and 2B in that it is possible to have an interlace function. The operation of the above-mentioned structure is described hereinafter.

During one field interval, signal charges generated in the n+ regions 32 due to an input image light are stored therein, because the electrodes 37 are supplied with a high level voltage from the shift register 39 in this period so that the charges are retained.

In a horizontal blanking period, an addressing pulse of a low level voltage is supplied to one of the electrodes 37, so that the potential levels of the n+ regions 32 in the line corresponding to that electrode are raised up. The signal charges in these n+ regions 32 then get over the potential barrier of the intrinsic gate formed in the n− region 33 and are penetratively transferred through the substrate. Thus, the charges reach the n+ region 35. After such a charge penetration is over, the voltage supplied to said one of the electrodes 37 returns back to its initial level.

In the next horizontal blanking period, the next one of the electrodes 37 is supplied with the addressing pulse. Thus, the charges in the n+ regions 32 are transferred on a line by line basis to the reverse side of the substrate 34.

The charges of the potential in the n+ regions 35 induced by the signal charges transferred as mentioned above are introduced into the n+ regions 41 through the transport lines 40. These charges are transmitted to the horizontal CCD 49 as follows.

When the transfer gate 43 is turned on under the control of a gate pulse applied thereto, a temporary bias charge (i.e.-a priming charge) in the temporary storage capacitor 45 is injected into the transport line 40. (This may be called "prime-in".) Then, the control pulse is supplied to the temporary storage capacitor 45 through a terminal 52 and the bootstrap capacitor 46. The potential level in the temporary storage capacitor 45 then becomes lower than that of the transport line 40. Therefore, the signal charge and the temporary bias charge on the transport line 40 are transferred into the temporary storage capacitor 45, i.e. the n+ region 42. (This may be called "prime-out".) Next, the control pulse supplied to the electrode 43 is turned off and then the pulse supplied to the terminal 52 is turned off. This process including "prime-in" and "prime-out" is called "priming transfer".

Thus, when the transfer gate 44 is turned on under the control of the gate pulse supplied thereto, only the signal charge in the temporary storage capacitor 45 is transferred into the horizontal CCD 49. (This may be called "skimming transfer".) During the horizontal scanning period, the horizontal CCD 49 effects a serial signal by transferring the charges to an output terminal under the control of gate pulses supplied to the electrodes 48.

In the above-mentioned operation, an interlace function is obtained if every second electrode among the electrodes 37 is supplied with the addressing pulse in one field period and the set of electrodes 37 to which the addressing pulse is supplied is altered every field.

Figure 4:
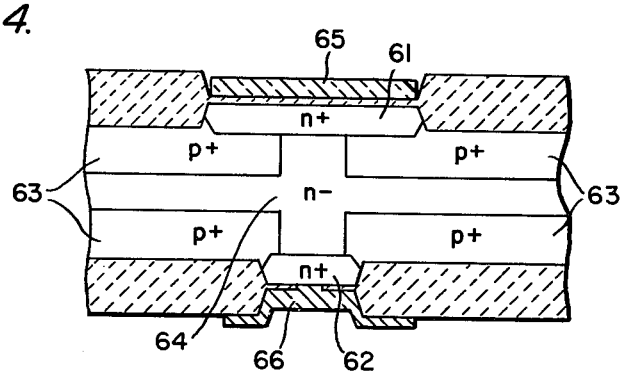
FIG. 4 is a sectional view showing another structure of the charge penetration region according to the invention.

FIG. 4 shows another embodiment of the penetrative charge-transfer portion according to the invention. An n+ region 61 operates as a photodiode and an n+ region 62 on the reverse side is a charge collecting area. The p+ regions 63 are provided separately at the front and the back surface area of an n− substrate 64 so as to define a channel forming region of an SIT. A numeral 65 denotes a transparent electrode and numeral 66 denotes a transport line. This structure is advantageous because of its ease of fabrication.

Figure 5:
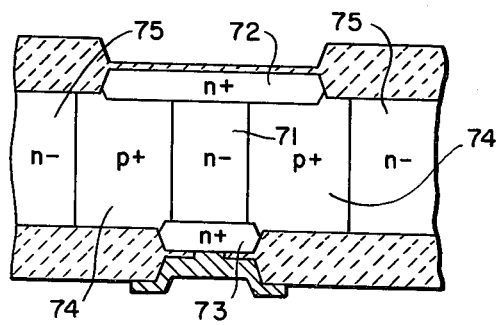

FIG. 5 shows further embodiment of the penetrative charge-transfer portion, which enables the charge transfer to be operated separately from the neighboring photo-sensing elements. An n− channel forming region 71 is formed between an n+ region 72 and an n+ region 73 by providing a p+ region 74 which is partially in a n− substrate 75, i.e. only under the n+ region 72.

FIG. 6 shows further embodiment of the penetrative charge-transfer portion. An n− channel forming region 81 which is located between n+ regions 82 and 83 is defined by providing p+ regions 84, such as the p+ region 74 in FIG. 5, but formed separately in the vertical direction. This structure is advantageous because of its ease of fabrication.

FIGS. 7A and 7B show an area imaging apparatus employing the penetrative charge-transfer structure of the embodiment in FIG. 6. In these figures, a parallel-serial conversion area M and a horizontal CCD 49 are the same as those of the embodiment of FIGS. 3A, 3B and 3C, and so the explanations thereof are omitted.

In FIGS. 7A and 7B, photodiodes are composed of n+ regions 91 which are separated by an oxide layer 92. In an n− substrate 93, p+ regions 94 and 95 are provided so as to form the control gates of SITs. The p+ region 94 at the front surface area of the substrate 93 and the p+ region 95 at the back surface area are formed separately from each other. The p+ regions 94 on each line are formed as a unit. The p+ regions 95 are also formed in such a manner. A vertical scanning shift register 96 is coupled to the p+ regions 94 and 95. The n+ regions 97 form charge collection areas. In order to connect the n+ regions 97 to the parallel-serial conversion area M, transporting lines 98 of Al electrodes are provided, in which the n+ regions 97 on each column line are connected as a unit.

A transfer of charges generated in the n+ region 91 is controlled by the voltage supplied to the p+ regions 94 and 95 from the shift register 96. In a horizontal blanking period, one line of the p+ regions 94 and 95 is selectively supplied with an addressing pulse of a high level voltage from the shift register 95, which causes the potential barrier height in the channel forming region surrounded by the p+ regions 94 and 95 to be lowered. The signal charges in the n+ regions 91 are then transferred to the n+ regions 97. After such a penetrative charge transfer has been completed, the voltage supplied to said one line of the p+ regions 94 and 95 returns back to its initial level.

The transfer from the transport line 98 to the horizontal CCD 49 is performed in similar manner to that of the embodiment of FIGS. 3A, 3B and 3C.

The addressing pulse from the shift register 96 is supplied in turn to p+ regions 94 and 95 on different lines for every horizontal blanking period, so that the charges in every line are transferred on a line by line basis.

Figure 8B:
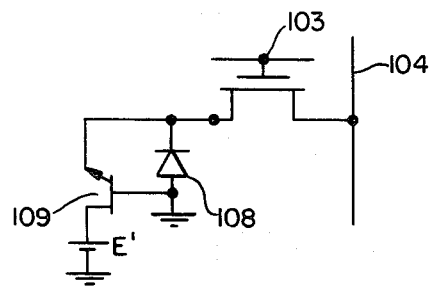
FIG. 8B is a diagram showing an equivalent circuit of the structure of FIG. 8A.

The structure for transferring charge penetratively through the substrate is applicable to an antiblooming use, such as is shown in FIGS. 8A and 8B. In these figures, an n+ region 101 corresponds to a photodiode. An n+ region 102 is a signal charge collection area and above the area between the n+ regions 101 and 102 is provided a transfer gate electrode 103 for controlling the charge transfer from the n+ region 101 to the n+ region 102. A metal electrode 104 is provided on the n+ region 102 and is used as a transport line.

Under the n+ region 101, an n− region 105 is extended to an n+ region 106 at the reverse side. The n− region 105 is defined by a p+ region 107 and forms a channel forming region. The p+ region 107 corresponds to the control gate. The n+ region 106 is supplied with a voltage from a voltage source E'.

In FIG. 8B, a photodiode 108 corresponds to the n+ region 101 in FIG. 8A and an SIT 109 corresponds to the vertical structure composed of the n+ region 101, n− region 105 and n+ region 106 in FIG. 8A.

Figure 8C:
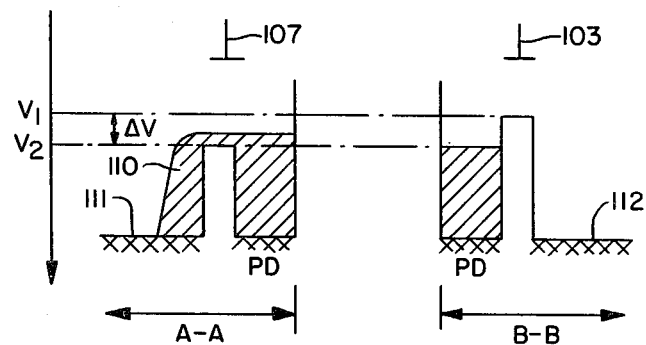
FIG. 8C is a diagram showing potentials along lines A—A and B—B in FIG. 8A.

FIG. 8C shows potentials along lines A—A and B—B in FIG. 8A. $V_1$ represents the height of the potential barrier between the n+ regions 101 and 102 when the gate 103 is off. $V_2$ represents the height of the potential barrier in the n− region 105, which is lower than the $V_1$ if the external voltage E' is supplied to the n+ region 106. An area 110 represents an excess charge and potential level and 111 represents a potential of the n− region 106. A potential level 112 represents the potential of the n+ region 102.

In the condition where an incident light has an intensity such that blooming is not caused, the signal charges generated in the n+ region 101 are normally transferred to the n+ region 102. On the other hand, under a condition where an incident light is so strong that blooming may be caused, the excess charges which above the maximum storage quantity of the n+ region 101 are removed through the SIT structure. Thus, the blooming is effectively suppressed.

Figure 9:
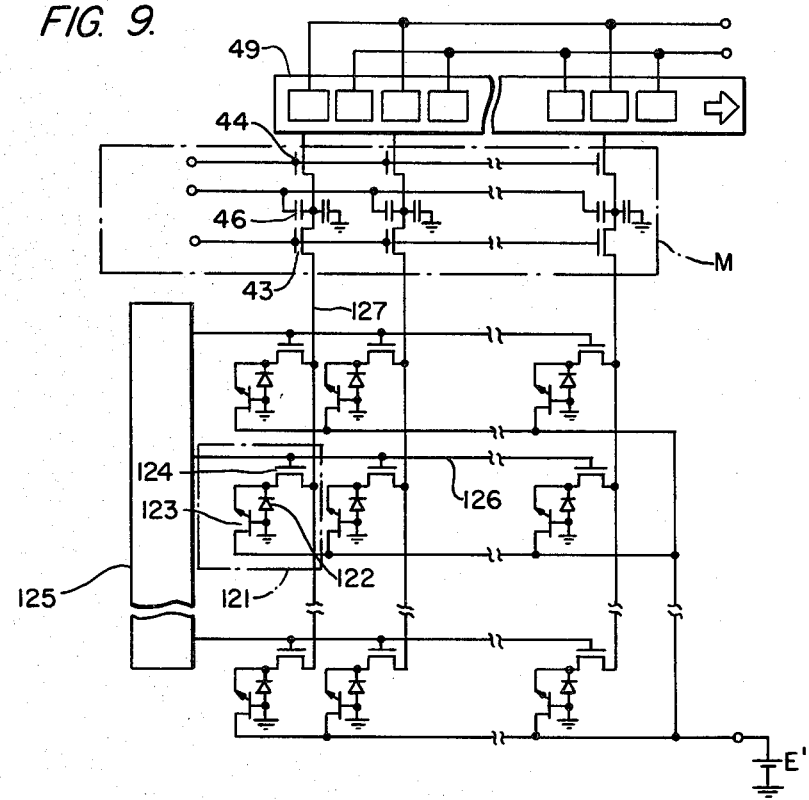
FIG. 9 is schematic circuit diagram of a solid state imaging apparatus using the structure of FIG. 8A.

FIG. 9 shows an example of an area imaging apparatus employing the above-mentioned anti-blooming structure. In this figure, a parallel-serial conversion area M and a horizontal CCD 49 are the same as those in FIG. 3.

An element 121 corresponds to the structure in FIG. 8B. A numeral 122 denotes a photodiode, 123 an SIT structure and 124 a switching MOS transistor. Each set of gates of the MOS transistors 124 on each line is coupled as a unit to a vertical scanning shift register 125 through a line 126. Each set of drains of the MOS transistors 124 on each column line is coupled as a unit to the parallel-serial conversion area M through a line 127.

In a horizontal blanking period, an addressing pulse is supplied to the gates of the MOS transistors 124 on one selected line and the charges are thereby transferred to each column line 127. If an excess charge is generated in the photodiode 122 due to a high incident light, it is removed through the SIT structure 123 before it is transferred through the MOS transistors 124. Therefore, blooming is not caused.

Figure 10:
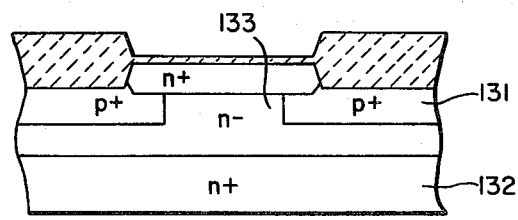
FIG. 10 is a sectional view of an element of a photo-sensing area with another anti-blooming structure.

The structure for removing excess charge may be such as that shown in FIG. 10. In this embodiment, a p+ region 131 exists only at the front surface area, being separated from an n+ region 132 at the back surface area. Such structure makes the fabrication process thereof easy.

What is claimed is:

1. A solid state imaging apparatus having a charge transfer arrangement and including a plurality of photosensor elements disposed in a matrix and a charge transfer means for transferring charges generated and accumulated in a photoelectric converting region of said matrix, said charges being transferred from a front surface area of a substrate to a back surface area of said substrate through said substrate, each of said plurality of photosensor elements comprising:

a first semiconductor region of a first type of conductivity disposed at said front surface area of said substrate and electrically isolated by an insulator region from first regions of the other of said plurality of photosensor elements, said first region being irradiated by an incident light;

a second semiconductor region of said first type of conductivity disposed at said back surface area of said substrate and electrically isolated by an insulator region from second regions of the other of said plurality of photosensor elements;

a third semiconductor region of said first type of conductivity and having a low impurity concentration which extends between and is in contact with said first and second regions; and a fourth semiconductor region of a second type of conductivity disposed around said third region so as to substantially isolate said third region from third regions of the other of said plurality of photosensor elements; said fourth region being supplied with a control voltage, whereby a channel is formed in said third region between said first and second regions.

2. A solid state imaging apparatus having a charge transfer arrangement as claimed in claim 1, wherein said fourth region is divided into a front zone which is disposed near said front surface area of said substrate and a back zone which is disposed near said back surface area of said substrate.

3. A solid state imaging apparatus having a charge transfer arrangement as claimed in claim 1, wherein said fourth region is formed as a unitary linked structure.

4. A solid state imaging apparatus having a charge transfer arrangement as claimed in claim 1, wherein said fourth region is divided laterally into a plurality of parts.

5. A solid state area imaging apparatus having a charge transfer arrangement as claimed in claim 1, further comprising:

a transparent electrode disposed above and in a capacitive coupling relationship to each of said first regions, wherein an application of a voltage to said electrode causes a potential of its respective first region to be made high by electrostatic induction.

6. A solid state area imaging apparatus with charge transfer means as claimed in claim 4, wherein said control voltage is selectively supplied to at least one of said plurality of parts of said fourth region.

* * * * *